(12) United States Patent
Braun et al.

(10) Patent No.: US 6,943,611 B2
(45) Date of Patent: Sep. 13, 2005

(54) DRIVE CONTROL CIRCUIT FOR A JUNCTION FIELD-EFFECT TRANSISTOR

(75) Inventors: Matthias Braun, Flörsbachtal (DE); Benno Weis, Hemhofen (DE)

(73) Assignee: Siemens Aktiengesellschaft, München (DE)

( * ) Notice: Subject to any disclaimer, the term of this patent is extended or adjusted under 35 U.S.C. 154(b) by 67 days.

(21) Appl. No.: 10/392,704

(22) Filed: Mar. 20, 2003

(65) Prior Publication Data

US 2003/0179035 A1 Sep. 25, 2003

(30) Foreign Application Priority Data

Mar. 22, 2002 (DE) .......................................... 102 12 863

(51) Int. Cl.[7] .......................................... H03K 17/687
(52) U.S. Cl. ........................................ 327/430; 327/108
(58) Field of Search ...................... 327/440, 108–109, 327/374–377, 420, 430–437, 427; 326/82–83

(56) References Cited

U.S. PATENT DOCUMENTS

| | | | |
|---|---|---|---|
| 4,068,254 A | | 1/1978 | Erdi .............................. 257/273 |
| 4,228,367 A | | 10/1980 | Brown ......................... 327/374 |
| 4,472,648 A | | 9/1984 | Prentice ....................... 327/541 |
| 4,553,110 A | * | 11/1985 | Kleinberg .............. 331/116 FE |
| 4,700,461 A | * | 10/1987 | Choi et al. ................... 438/149 |
| 5,168,175 A | * | 12/1992 | Endo ............................ 327/430 |
| 5,422,593 A | * | 6/1995 | Fujihira ....................... 327/561 |
| 5,432,471 A | * | 7/1995 | Majumdar et al. .......... 327/380 |
| 5,900,768 A | * | 5/1999 | Price ............................ 327/427 |
| 5,936,360 A | * | 8/1999 | Kaneko ....................... 315/307 |
| 6,208,535 B1 | * | 3/2001 | Parks ........................... 363/26 |
| 6,365,919 B1 | * | 4/2002 | Tihanyi et al. ................ 257/77 |

FOREIGN PATENT DOCUMENTS

GB          2 104 331          3/1983

OTHER PUBLICATIONS

"Halbleiter–Schaltungstechnik" [Semiconductor Circuit Technology], U. Tietze and Ch. Schenk, 9$^{th}$ Edition, pp. 83 to 101.

* cited by examiner

*Primary Examiner*—My-Trang Nu Ton
(74) *Attorney, Agent, or Firm*—Henry M. Feiereisen

(57) ABSTRACT

A drive control circuit for a junction field-effect transistor having a gate terminal, a drain terminal and a source terminal as well as a gate leakage current and a maximally permissible gate current, includes a current supply which feeds the gate and produces a control current which is greater than the gate leakage current and smaller than the maximally permissible gate current for turning the junction field-effect transistor off.

10 Claims, 3 Drawing Sheets

“Semiconductor Circuit Technology”]

DRIVE CONTROL CIRCUIT FOR A JUNCTION FIELD-EFFECT TRANSISTOR

CROSS-REFERENCES TO RELATED APPLICATIONS

This application claims the priority of German Patent Application, Serial No. 102 128 63.4, filed Mar. 22, 2002, pursuant to 35 U.S.C. 119(a)–(d), the disclosure of which is incorporated herein by reference.

BACKGROUND OF THE INVENTION

The present invention relates to a drive control circuit for a junction field-effect transistor.

Junction field-effect transistors (JFETs), for example, like those disclosed by U. Tietze and Ch. Schenk in Halbleiter-Schaltungstechnik [*Semiconductor Circuit Technology*], $9^{th}$ Edition 1990, pages 83 to 101, have the characteristic that they are conducting with a gate voltage of 0 V, but can be pinched off as an n-channel type with negative gate voltage or as a p-channel type with positive gate voltage. However, the required gate voltages vary widely for different samples of same conduction type.

FIG. 1 shows two typical characteristic curves of the gate leakage currents $I_G$ for two different junction field-effect transistors. As is shown, the leakage current $I_G$ of a junction field-effect transistor JFET1 rises significantly at a voltage $U_1$. In other words, the voltage $U_1$ can only be exceeded slightly at the gate of the JFET1, since otherwise excessive energy dissipation occurs at the gate. In order for the junction field-effect transistor JFET 1 to block reliably, the gate voltage should exceed a voltage $U_{10}$. Therefore, the gate voltage $U_{10}$ is only slightly below the gate voltage $U_1$, typically 5 to 10 V. If a fixed gate voltage is selected for all junction field-effect transistors of a converter and is slightly greater than the gate voltage $U_{10}$ and smaller than the gate voltage $U_1$, a junction field-effect transistor JFET2 is not able to block since the gate voltage is, for example, below its required minimum gate voltage $U_{20}$. On the other hand, if a gate voltage is selected to exceed the required minimum gate voltage $U_{20}$ of the field-effect transistor JFET2, the junction field-effect transistor JFET1 would be destroyed by such a drive control since its gate current would rise excessively.

In junction field-effect transistors used in converters, the pinch-off voltages can fluctuate, for example, in a range between −17 V and −57 V. Conventional drive control circuits, which apply the gate-source voltages selectively to 0 V for switching ON and apply a negative voltage for switching OFF, the drive control voltage must be adjusted individually to the respective junction field-effect transistor. This is very complex and unacceptable for mass production.

It would therefore be desirable and advantageous to provide an improved drive control circuit for a junction field-effect transistor to obviate prior art shortcomings.

SUMMARY OF THE INVENTION

According to one aspect of the present invention, a drive control circuit for a junction field-effect transistor of a type having terminals for gate, drain and source as well as a gate leakage current and a maximally permissible gate current, includes a current supply for feeding a gate and producing a control current, which is greater than the gate leakage current and smaller than the maximally permissible gate current, for turning off the junction field-effect transistor.

The present invention is based on the recognition that it is not the gate voltages but the gate (leakage) current that is adjusted for turning off the junction field-effect transistor. Hereby, it is assumed that the gate of the junction field-effect transistor exhibits a current-voltage characteristic curve in which the gate leakage current increases monotonously with rising gate voltage.

The gate voltage is adjusted in such a way that a certain gate leakage current flows across the gate of the junction field-effect transistor. The gate leakage current is selected as to definitely pinch off the junction field-effect transistor, without thermally endangering the gate. In the exemplified junction field-effect transistors JFET 1 and JFET 2 of FIG. 1, a current 11 is selected which lies slightly above the plateau region of both two junction field-effect transistors JFET 1, JFET 2. Thereby, the necessary gate voltages for the junction field-effect transistors JFET 1 and JFET 2 adjust themselves accordingly.

Preferred, however, is a regulation of the control current by providing the drive control circuit with a control device for controlling the current supply.

According to one variation of a control device, there may be provided a measuring unit for determining the source current and a comparing unit for comparing the source current with a limit value, whereby the control current is increased until the source current drops below the limit value. FIG. 2 depicts the gate current $I_G$ and the source current $I_S$ as a function of the gate voltage $U_G$. As stated above in with reference to FIG. 1, the gate current $I_G$ rises with increasing gate voltage $U_G$. However, the source current $I_S$ decreases with rising gate voltage $U_G$ since the channel of the junction field-effect transistor is progressively more pinched off, until the entire drain current flows across the gate at a very high gate voltage $U_G$.

According to another variation of a control device, there may be provided a measuring unit for determining the source current and a proportional control element, whereby the control current is adjusted to a certain relationship relative to the source current.

According to still another variation of a control device, there may be provided a measuring unit for evaluating the gate current and the source current separately, and a minimum detector for ascertaining the minimum of the drain current by separately determining the minima of source current and gate current and recognizing a minimum of the drain current in the presence of two minima. The intent of this variation is to minimize the static reverse direction losses. This is achieved when the drain current of the junction field-effect transistor becomes minimal. The drain current is the sum of the gate current $I_G$ and the source current $I_S$. This sum of gate current $I_G$ and source current $I_S$ has a minimum, as shown in FIG. 2, whereby according to another feature of the present invention, the gate voltage $U_G$ is controlled with respect to this minimum. The input variables for this control are based either on a measurement of the drain current or on a measurement of gate current and source current.

The measures as described above are essentially applicable to the static reverse behavior of the junction field-effect transistor. However, when connecting through the junction field-effect transistor, higher gate currents must be permitted in order to achieve a high switching speed. For that reason, during the power-up time, the drive control circuit operates in such a way that the control current, and in particular its control, are switched off. Switching on is then realized, for example, in conventional manner, such as e.g. changeover to a voltage-controlled operation.

According to another feature of the present invention, the junction field-effect transistor may be realized with silicon-carbide technology.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
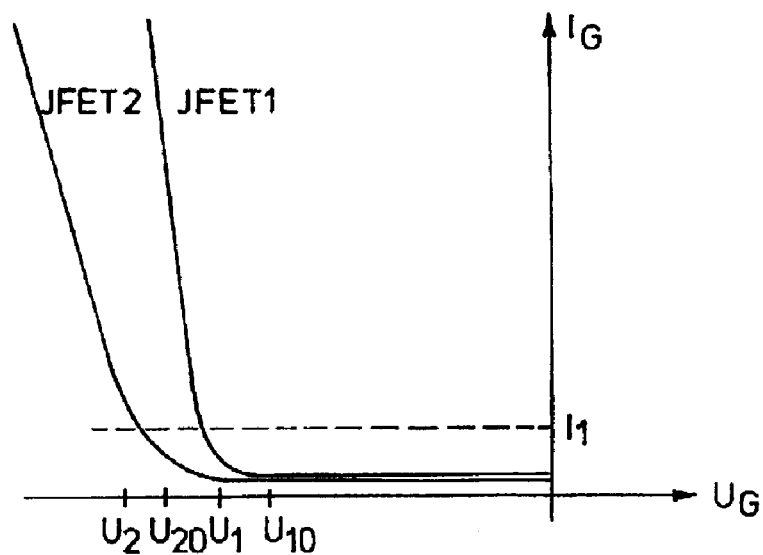
FIG. 1 is a graphical illustration of the gate current as a function of the gate voltage with respect to two exemplified junction field-effect transistors of same type.
Figure 2:
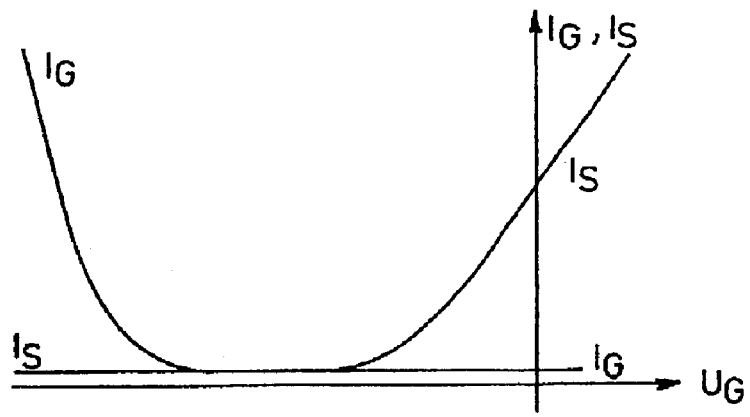
FIG. 2 is a graphical illustration of the gate current and the source current as a function of the gate voltage of a junction field-effect transistor.

Throughout all the Figures, same or corresponding elements are generally indicated by same reference numerals. These depicted embodiments are to be understood as illustrative of the invention and not as limiting in any way.

Figure 3:
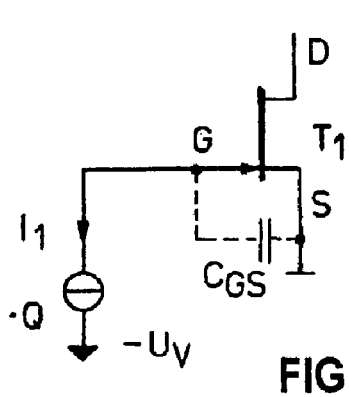
FIG. 3 is a circuit diagram of a first embodiment of a drive control circuit according to the present invention.

Turning now to the drawing, and in particular to FIG. 3, there is shown a circuit diagram of a first embodiment of a drive control circuit according to the present invention, including a junction field-effect transistor $T_1$ with a drain terminal D, a source terminal S and a gate terminal G. Forming between the gate G and source S is a parasitic gate source capacitance $C_{GS}$. The gate G is supplied with power via a current supply Q from a negative supply potential $-U_V$. The current impressed by the current supply Q corresponds to the current $I_1$ from FIG. 1. The negative supply potential $-U_V$ results from the fact that the junction field-effect transistor is an n-channel type.

Figure 4:
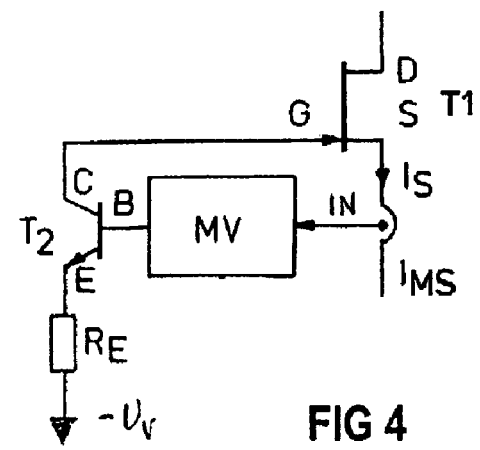
FIG. 4 is a circuit diagram of a second embodiment of a drive control circuit according to the present invention.

FIG. 4 shows a circuit diagram of a second embodiment of a drive control circuit according to the present invention. Parts corresponding with those in FIG. 3 are denoted by identical reference numerals and not explained again. In this embodiment, provision is made for a controlled path of a bipolar transistor $T_2$ having a base B, a collector C, and an emitter E, instead of a current supply Q. The description below will center on the differences between the embodiments. An emitter resistance $R_E$ is placed into the emitter line of the transistor $T_2$. In the embodiment of FIG. 4, the transistor $T_2$ is a bipolar transistor of the npn-type. The collector C of the bipolar transistor $T_2$ is connected to the gate G of the junction field-effect transistor $T_1$, while the emitter E of the bipolar transistor $T_2$ is connected via the emitter resistance $R_E$ to the negative supply voltage $-U_V$.

The base B of the bipolar transistor $T_2$ is connected to the output of a measuring amplifier MV, whose input is controlled by a current measuring unit IN which measures the current $I_S$ flowing in the source line of the junction field-effect transistor $T_1$. In this case, the gate current $I_G$ is proportional to the source current $I_S$. A high source current $I_S$ leads therefore to an increased gate current $I_G$ and thus to intensified pinching off.

Figure 4A:
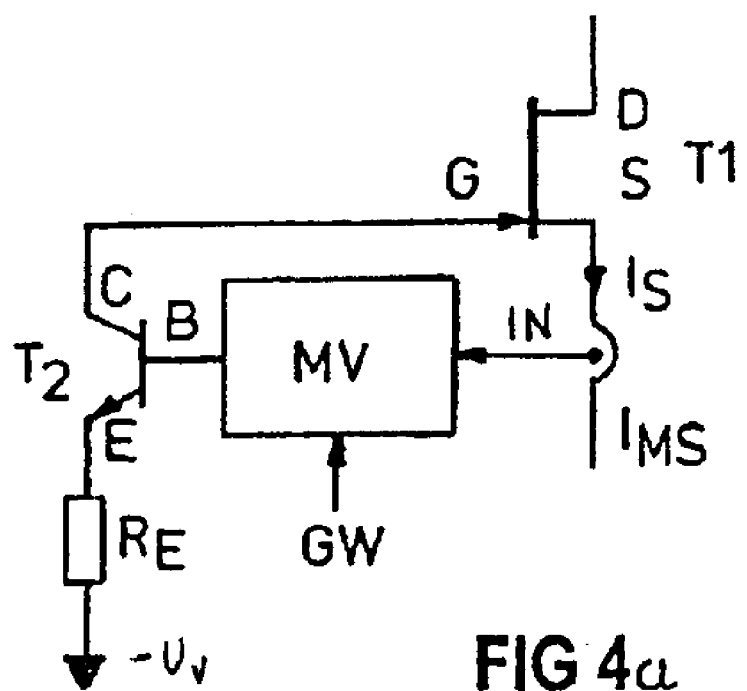
FIG. 4a is a circuit diagram of a modified embodiment of the drive control circuit of FIG. 4.

FIG. 4a shows an alternative configuration in which the measuring amplifier MV can be operated with very high amplification. It then functions as a comparator, whereby the gate current $I_G$ is increased long enough for the source current to drop below a limit value GW. The limit value GW can be given externally or generated in the measuring amplifier MV.

Figure 5:
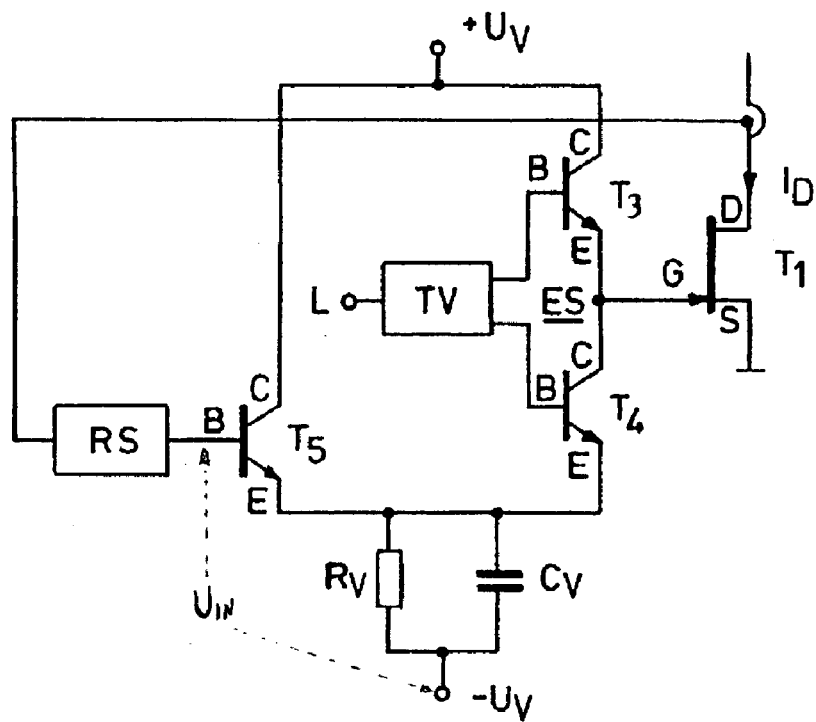
FIG. 5 is a circuit diagram of a third embodiment of a drive control circuit according to the present invention.

FIG. 5 shows a circuit diagram of a third embodiment of a drive control circuit according to the present invention. In this embodiment, the junction field-effect transistor T1 is controlled at its gate terminal by means of a push-pull final stage ES. The push-pull final stage ES has two bipolar transistors $T_3$ and $T_4$, each of the npn-type. The controlled path (emitter-collector path) of the bipolar transistor $T_3$ is switched between the gate G of the junction field-effect transistor $T_1$ and a positive supply voltage $+U_V$, while the controlled path (emitter-collector path) of the bipolar transistor $T_4$ is switched between the gate G of the junction field-effect transistor $T_1$ and a junction point which the emitter E of a bipolar transistor $T_5$ of the npn-type, a terminal of a resistor $R_V$, and a terminal of a capacitor $C_V$ is further connected to. The bases of the bipolar transistors $T_3$ and $T_4$ are hereby switched via a driver amplifier TV by a switching signal L. The voltage across the push-pull final stage ES is controlled by means of the bipolar transistor $T_5$. The voltage between the base of the bipolar transistor $T_5$ and the negative supply voltage $-U_V$, i.e. the control voltage $U_{in}$, are constantly changed by a small value by means of a control circuit (minimum detector) RS. The drain current $I_D$ is hereby measured and the control voltage $U_{in}$ is changed in the direction in which the drain current $I_D$ decreases. In this way, the drain current $I_D$ can be adjusted to a minimum. Also, instead of a current control, a supply voltage can be adjusted, as shown in FIG. 5.

Figure 6:
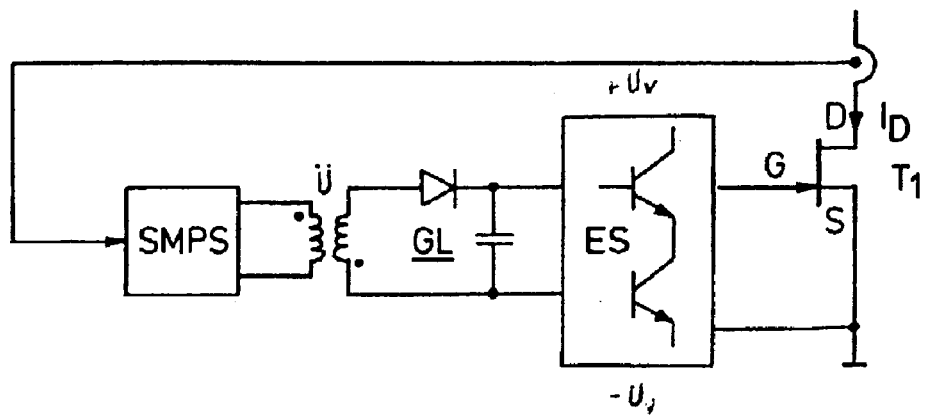
FIG. 6 is a circuit diagram of a drive control circuit according to the present invention incorporated in an inverter arrangement.

The measure shown in FIG. 5 can be further improved upon in a way as shown in FIG. 6 by adjusting the supply voltage, defined by negative and positive supply potentials, $+Uv$ and $-Uv$, to the minimum drain current $I_D$, such that the feeding (switching) power supply adjusts the desired supply voltage. Thus, the control losses can be minimized, without requiring the parallel run controller (bipolar transistor $T_5$) shown in FIG. 5. Instead, the supply of the final stage ES is realized directly from an electric rectifier GL which is controlled by means of a transformer Ü for a potential separation by a switch-type regulator SMPS (switched mode power supply) in dependence on the drain current $I_D$.

Common to all above embodiments is the fact that the junction field-effect transistor $T_1$ is a silicon carbide (SiC) transistor. Of course, it is also conceivable to provide two control circuits which are connected in parallel for switching a device for the control current ON and OFF.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and their equivalents:

1. A drive control circuit for a junction field-effect transistor having a gate terminal, a drain terminal and a source terminal as well as a gate leakage current and a maximally permissible gate current, said drive control circuit comprising a current supply which feeds the gate and produces a gate control current which is greater than the gate leakage current and smaller than the maximally permissible gate current for turning the junction field-effect transistor off, and a control device for controlling the gate control current, said control device including a measuring amplifier having a first input measuring a source current of the junction field-effect transistor, and a second input receiving a limit value, wherein the measuring amplifier generates an output signal that adjusts the gate control current until the source current drops below the limit value.

2. The drive control circuit of claim 1, wherein the control device includes a switching controller that adjusts a supply voltage of a final stage that controls the gate control current of the junction field-effect transistor.

3. The drive control circuit of claim 2, wherein a drive voltage is produced for the length of time that the junction field-effect transistor (T1) is switched on.

4. The drive control circuit of claim 1, wherein the gate control current is switched off for a length of time that the junction field-effect transistor is switched on.

5. A drive control circuit according to claim 1, wherein the junction field-effect transistor is a silicon carbide (SiC) field-effect transistor.

6. The drive control circuit of claim 1, wherein a drive voltage is produced for the length of time that the junction field-effect transistor (T1) is switched on.

7. A drive control circuit for a junction field-effect transistor having a gate terminal, a drain terminal and a source terminal as well as a gate leakage current and a maximally permissible gate current, said drive control circuit comprising a current supply which feeds the gate and produces a gate control current which is greater than the gate leakage current and smaller than the maximally permissible gate current for turning the junction field-effect transistor off, and a control device for controlling the gate control current, said control device including a measuring amplifier having an input that measures a source current of the junction field-effect transistor, wherein the measuring amplifier generates an output signal that adjusts the gate control current so as to be proportional to the source current.

8. The drive control circuit of claim 7, wherein the control device includes a switching controller that adjusts a supply voltage of a final stage that controls the gate control current of the junction field-effect transistor.

9. The drive control circuit of claim 8, wherein the gate control current is switched off for a length of time that the junction field-effect transistor is switched on.

10. A drive control circuit according to claim 7, wherein the junction field-effect transistor is a silicon carbide (SiC) field-effect transistor.

* * * * *